(12) United States Patent
Li et al.

(10) Patent No.: US 8,552,439 B2
(45) Date of Patent: Oct. 8, 2013

(54) LIGHT-EMITTING DIODE PACKAGE

(75) Inventors: Yuet-Wing Li, Tainan (TW); Kuan-Hsu Fan-Chiang, Tainan (TW); Sin-Hua Ho, Tainan (TW)

(73) Assignees: Himax Display, Inc., Tainan (TW); Himax Technologies Limited, Tainan (TW)

( * ) Notice: Subject to any disclaimer, the term of this patent is extended or adjusted under 35 U.S.C. 154(b) by 68 days.

(21) Appl. No.: 13/274,159

(22) Filed: Oct. 14, 2011

(65) Prior Publication Data

US 2012/0256217 A1 Oct. 11, 2012

Related U.S. Application Data

(60) Provisional application No. 61/472,627, filed on Apr. 7, 2011.

(51) Int. Cl.
*H01L 21/02* (2006.01)

(52) U.S. Cl.
USPC .............. 257/89; 257/90; 257/92; 257/93; 257/99; 257/E33.001

(58) Field of Classification Search
USPC .................... 257/88–99, E33.001
See application file for complete search history.

(56) References Cited

U.S. PATENT DOCUMENTS

| | | | | |
|---|---|---|---|---|
| 4,289,381 A | * | 9/1981 | Garvin et al. | 427/163.1 |
| 5,748,368 A | * | 5/1998 | Tamada et al. | 359/485.03 |
| 6,208,463 B1 | * | 3/2001 | Hansen et al. | 359/485.05 |
| 6,234,634 B1 | * | 5/2001 | Hansen et al. | 353/20 |
| 6,785,050 B2 | * | 8/2004 | Lines et al. | 359/485.03 |
| 7,046,442 B2 | * | 5/2006 | Suganuma | 359/485.03 |
| 7,085,051 B2 | * | 8/2006 | Miyazawa et al. | 359/485.05 |
| 7,113,335 B2 | * | 9/2006 | Sales | 359/485.03 |
| 7,808,011 B2 | * | 10/2010 | Kim et al. | 257/98 |
| 8,027,087 B2 | * | 9/2011 | Perkins et al. | 359/485.05 |
| 2002/0122235 A1 | * | 9/2002 | Kurtz et al. | 359/254 |
| 2005/0088739 A1 | * | 4/2005 | Chiu et al. | 359/486 |
| 2007/0064407 A1 | * | 3/2007 | Huang et al. | 362/19 |
| 2008/0042546 A1 | * | 2/2008 | Huang et al. | 313/495 |
| 2010/0127238 A1 | * | 5/2010 | Kim et al. | 257/13 |
| 2010/0270569 A1 | * | 10/2010 | Grotsch et al. | 257/98 |
| 2010/0277887 A1 | * | 11/2010 | Su et al. | 362/19 |
| 2010/0284073 A1 | * | 11/2010 | Iler et al. | 359/486 |
| 2011/0037928 A1 | * | 2/2011 | Little | 349/96 |
| 2011/0057557 A1 | * | 3/2011 | Chi et al. | 313/499 |
| 2012/0086887 A1 | * | 4/2012 | Lee et al. | 349/62 |
| 2012/0200801 A1 | * | 8/2012 | Wheatley et al. | 349/61 |
| 2012/0287677 A1 | * | 11/2012 | Wheatley et al. | 362/627 |

* cited by examiner

*Primary Examiner* — Michael Lebentritt
(74) *Attorney, Agent, or Firm* — J.C. Patents

(57) ABSTRACT

A light-emitting diode (LED) package including a substrate, an LED chip, a polarizer, and a supporter is provided. The LED chip is disposed on the substrate. The polarizer is disposed above the LED chip. The supporter is disposed on the substrate for supporting the polarizer.

9 Claims, 7 Drawing Sheets

LIGHT-EMITTING DIODE PACKAGE

CROSS-REFERENCE TO RELATED APPLICATION

This application claims the priority benefit of U.S. Provisional Application Ser. No. 61/472,627, filed Apr. 7, 2011. The entirety of the above-mentioned patent application is hereby incorporated by reference herein and made a part of this specification.

BACKGROUND OF THE INVENTION

1. Field of the Invention

The invention generally relates to a light source package and, in particular, to a light-emitting diode (LED) package.

2. Description of Related Art

A light emitting diode (LED) has many advantages, such as small volume, higher illumination efficiency, energy saving, and so on. Especially, the photo-electrical power conversion efficiency of the light emitting diode has been rapidly improved during the last twenty years, so that the light emitting diode is regarded as the main illumination source in the future. For energy conservation, the light emitting diode will certainly and gradually substitute for a lot kinds of today's illumination sources, such as light bulbs.

Today, the light emitting diodes are applied popularly and commonly used in traffic signal lights, electric boards, flash lights, and so on. Although improving the high-power illuminating technology or quality of the light emitting diodes is the future trend and demanded urgently, such as demanded in the application of reading light or protruding light, etc., there are also other applications to develop. For example, when a polarized beam is needed in an optical system, a polarization conversion system (PCS) is usually used in the conventional technique to convert a non-polarized beam from the light source to a polarized beam. However, the conventional PCS has large volume, so that the volume of the optical system using the conventional PCS is hard to reduce.

SUMMARY OF THE INVENTION

Accordingly, the invention is directed to an LED package, which is capable of providing a polarized light.

An embodiment of the invention provides an LED package including a substrate, an LED chip, a polarizer, and a supporter. The LED chip is disposed on the substrate. The polarizer is disposed above the LED chip. The supporter is disposed on the substrate for supporting the polarizer.

In the embodiment of the invention, the polarizer is integrated in the LED package by using the supporter to support the polarizer, so that the LED package can provide a polarized light and have small volume.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
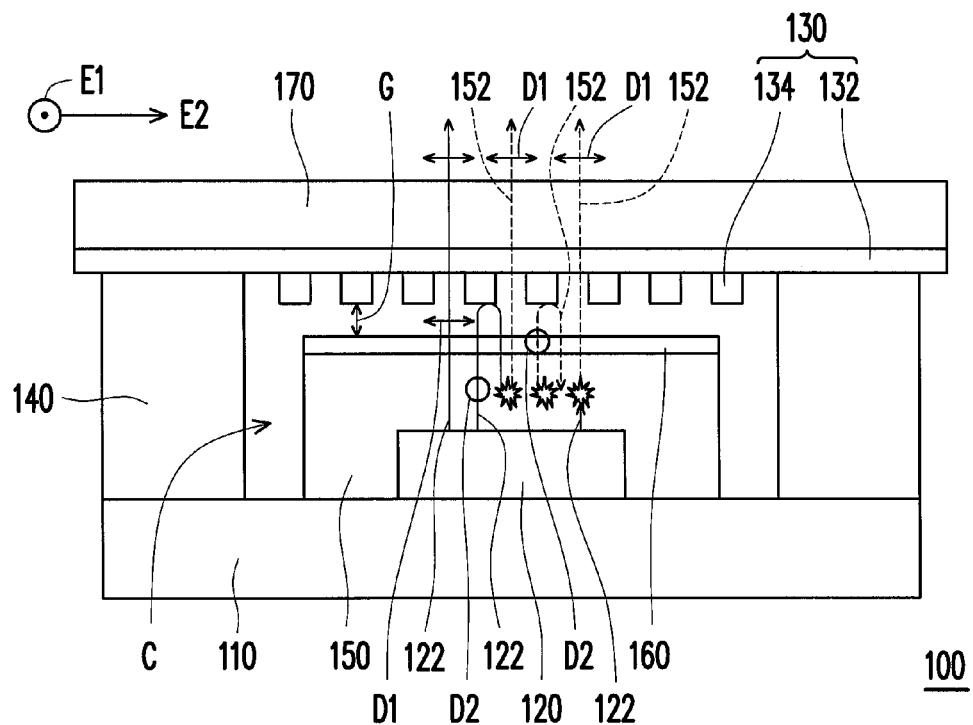
FIG. 1 is a schematic cross-sectional view of an LED package according to an embodiment of the invention.

Reference will now be made in detail to the embodiments of the invention, examples of which are illustrated in the accompanying drawings. Wherever possible, the same reference numbers are used in the drawings and the description to refer to the same or like parts.

Figure 2:
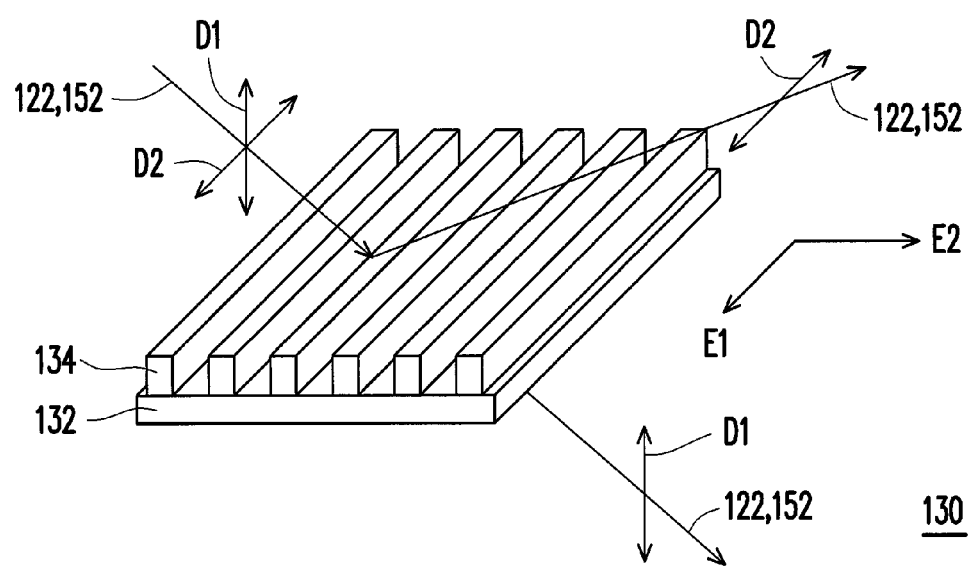
FIG. 2 is a perspective view of the polarizer in FIG. 1.
Figure 3:
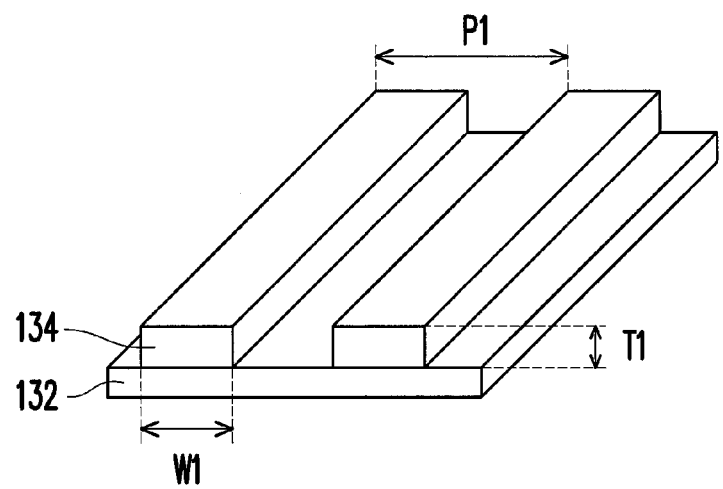
FIG. 3 is an enlarged partial view of the polarizer in FIG. 2.

FIG. 1 is a schematic cross-sectional view of an LED package according to am embodiment of the invention. FIG. 2 is a perspective view of the polarizer in FIG. 1. FIG. 3 is an enlarged partial view of the polarizer in FIG. 2. Referring to FIGS. 1-3, the LED package 100 in this embodiment includes a substrate 110, an LED chip 120, a polarizer 130, and a supporter 140. The LED chip 120 is disposed on the substrate 110. The polarizer 130 is disposed above the LED chip 120. The supporter 140 is disposed on the substrate 110 for supporting the polarizer 130. The substrate 110 is, for example, a circuit substrate, and the LED chip 120 is electrically connected to the circuit substrate.

In this embodiment, the LED package 100 further includes a fluorescent layer 150 wrapping the LED chip 120. Moreover, in this embodiment, the fluorescent layer 150 is a phosphor layer. For example, the LED chip 210 is a blue LED chip, and the fluorescent layer 150 is an yttrium aluminum garnet (YAG) layer. However, in another embodiment, the fluorescent layer 150 may be a terbium aluminum garnet (TAG) layer or another phosphor layer. In this embodiment, the LED chip 210 is capable of emitting a first light 122, and the fluorescent layer 150 is disposed on the transmission path of the first light 122 and capable of converting the first light 122 into a second light 152, wherein the wavelength of the first light 122 is shorter than the wavelength of the second light 152. In this embodiment, the first light 122 is a blue light, and the second light 152 is a yellow light.

In this embodiment, a gap G exists between the polarizer 130 and the LED chip 120. The gap G is, for example, an air gap, a gas gap, or a vacuum gap, wherein the gas gap may includes at least one of nitrogen, argon, and other appropriate gases. Specifically, a containing space C is formed by the substrate 110, the supporter 140, and the polarizer 130, and the LED chip 120 is disposed inside the containing space C. The containing space may be filled with air or gas, or the containing space may be a vacuum space, wherein the gas may includes at least one of nitrogen, argon, and other appropriate gases.

In this embodiment, the LED package 100 further includes an anti-reflection layer 160 disposed on the fluorescent layer 150, so that the reflection of the first light 122 and the second light 152 on the interface between the fluorescent layer 150 and the gap G is reduced.

In this embodiment, the polarizer 130 is a wire-grid polarizer. Specifically, the polarizer 130 may include a transparent substrate 132 and a plurality of metal wires 134. In this embodiment, the transparent substrate 132 is, for example, a glass substrate, a plastic substrate, or another appropriate transparent substrate. Each of the metal wires 134 extends along a first direction E1, and the metal wires 134 are arranged along a second direction E2. In this embodiment, the first direction E1 is substantially perpendicular to the second direction E2. Moreover, in this embodiment, the metal wires 134 satisfy $0.2<d/\lambda<0.5$, wherein d is a pitch P1 of the metal wires 134 along the second direction E2, and $\lambda$ is a wavelength of the first light 122 emitted by the LED chip 120. In addition, in this embodiment, the metal wires 134 also satisfy $0.2<d/\lambda'<0.5$, wherein $\lambda'$ is the wavelength of the second light 152.

The first light 122 emitted by the LED chip 120 is non-polarized. In other words, a portion of the first light 122 has a first polarization direction D1, and the other portion of the first light 122 has a second polarization direction D2. The first polarization direction D1 (i.e. the p-polarized direction) is substantially perpendicular to the first direction E1, and the second polarization direction D2 (i.e. the s-polarized direction) is substantially parallel to the first direction E1, wherein the first polarization direction D1 is substantially perpendicular to the second polarization direction D2. A part of the portion of the first light 122 having the first polarization direction D1 passes through the fluorescent layer 150, the anti-reflection layer 160, the gap G, and the polarizer 130 in sequence. Another part of the portion of the first light 122 having the first polarization direction D1 is converted into a non-polarized second light 152 by the fluorescent layer 150. A part of the portion of the first light 122 having the second polarization direction D2 passes through the fluorescent layer 150, the anti-reflection layer 160, and the gap G in sequence, and is then reflected by the polarizer 130 to the florescent layer 150 again, so that the portion of the first light 122 having the second polarization direction D2 is recycled. The recycled portion of the first light 122 may be converted into the second light 152 when returning to the fluorescent layer 150. Moreover, another part of the portion of the first light 122 having the second polarization direction D2 may be converted into the second light 152 by the florescent layer 150. The second light 152 converted from the first light 122 is non-polarized. In other words, a portion of the second light 152 has the first polarization direction D1 (i.e. the p-polarized direction), and the other portion of the second light 152 has the second polarization direction D2 (i.e. the s-polarized direction). The portion of the second light 152 having the first polarization direction D1 passes through the anti-reflection layer 160, the gap G, and the polarizer 130 in sequence. The portion of the second light 152 having the second polarization direction D2 is reflected by the polarizer 130.

As a result, the LED package 100 may recycle light to achieve higher light efficiency. For example, when 40% of the first light 122 passes through the polarizer 130, and when 45% of the first light 122 is reflected by the polarizer 130, the light efficiency of the LED package 100 is, for example, 73%. When 45% of the first light 122 passes through the polarizer 130, and when 45% of the first light 122 is reflected by the polarizer 130, the light efficiency of the LED package 100 is, for example, 83%. That is to say, in this embodiment, 73%-83% of the light emitted from the LED package becomes polarized and fully utilized.

In this embodiment, the polarizer 130 is integrated in the LED package 100 by using the supporter 140 to support the polarizer 120, so that the LED package 100 can provide a polarized light and have small volume. As a result, compared with a conventional optical system using PCS to form a polarized light, the volume of an optical system using the LED package 100 may be effectively reduced Moreover, the LED package 100 having wire-grid polarizer can be operated in a high temperature, and is robust.

In this embodiment, the LED package 100 further includes a transparent substrate 170, wherein the polarizer 130 may disposed on the transparent substrate 170, and the supporter 140 may serve as a spacer disposed between the substrate 110 and the polarizer 130.

Figure 4:
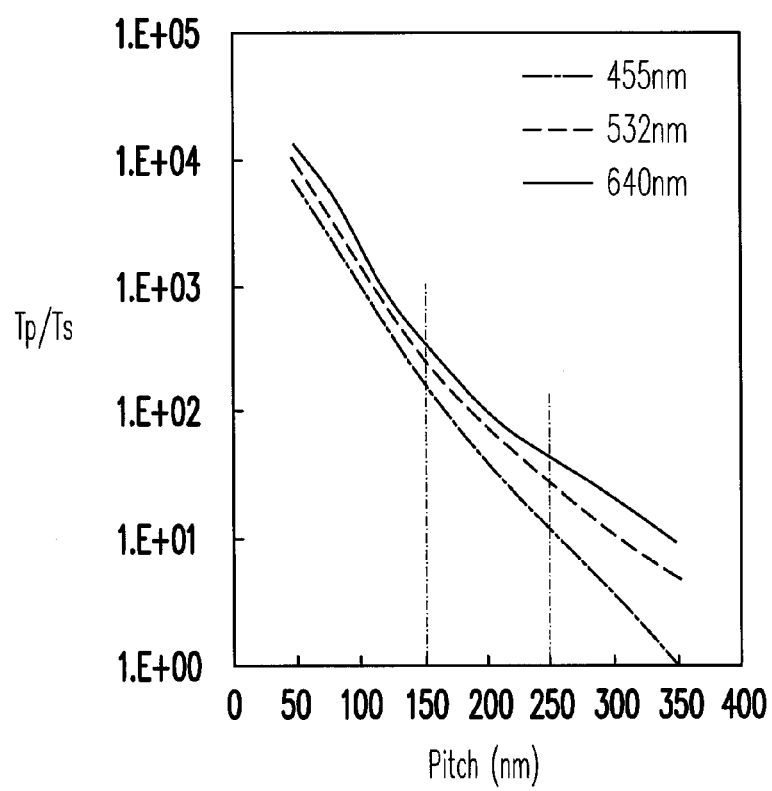
FIG. 4 is a curve diagram of the ratio of the transmittance of the p-polarized light to the transmittance of the s-polarized light of the polarizer in FIG. 1 versus the pitch of the metal wires in FIG. 3.
Figure 5A:
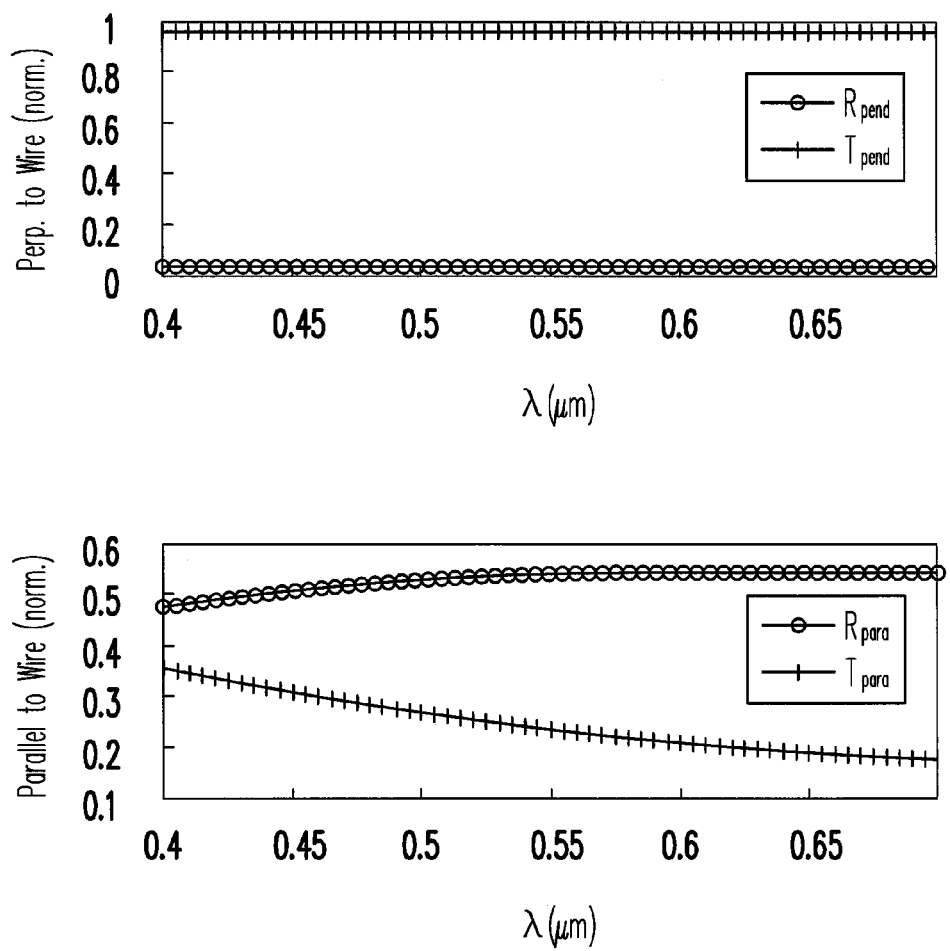
FIGS. 5A-5D are respectively transmittance and reflectance spectra of the polarizer in FIGS. 1-3 when the duties of the metal wires are 10%, 40%, 60%, and 90%, respectively.
Figure 5B:
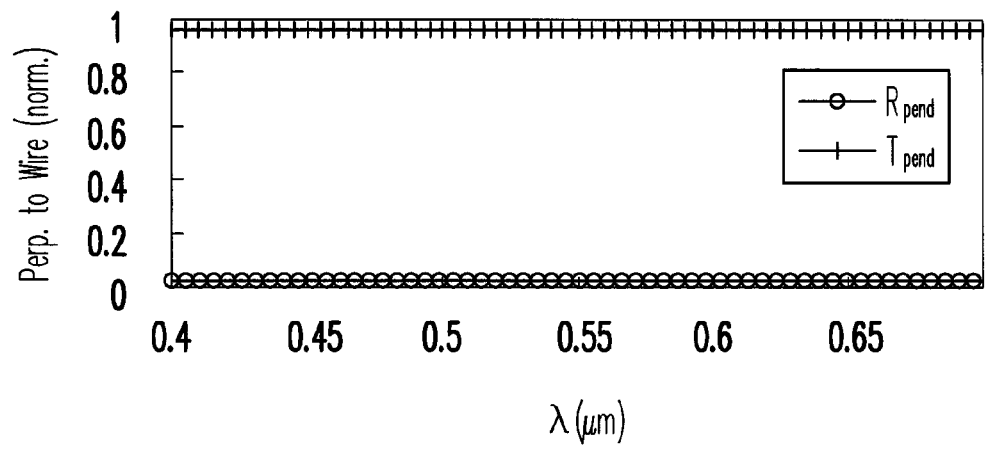
Figure 5B:
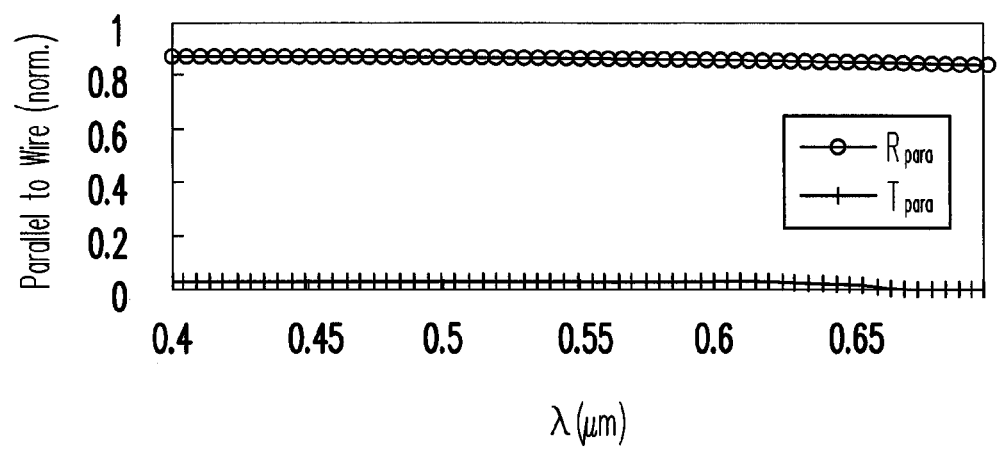
Figure 5C:
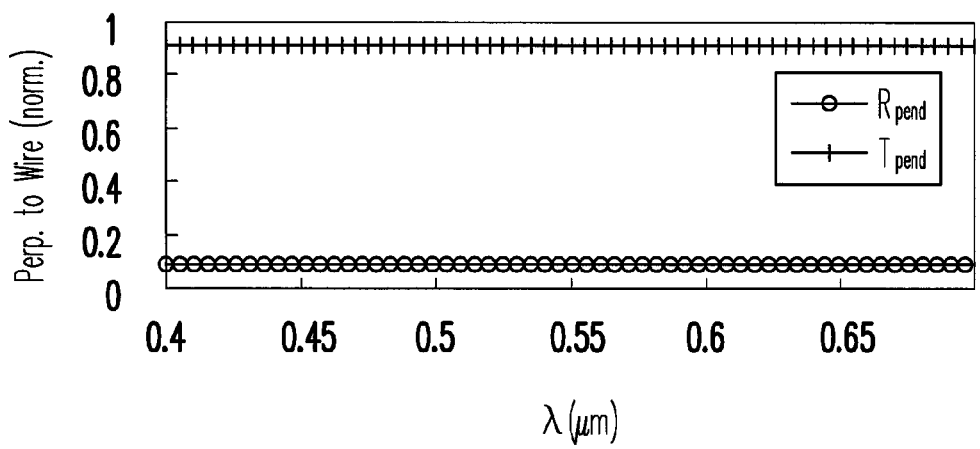
Figure 5C:
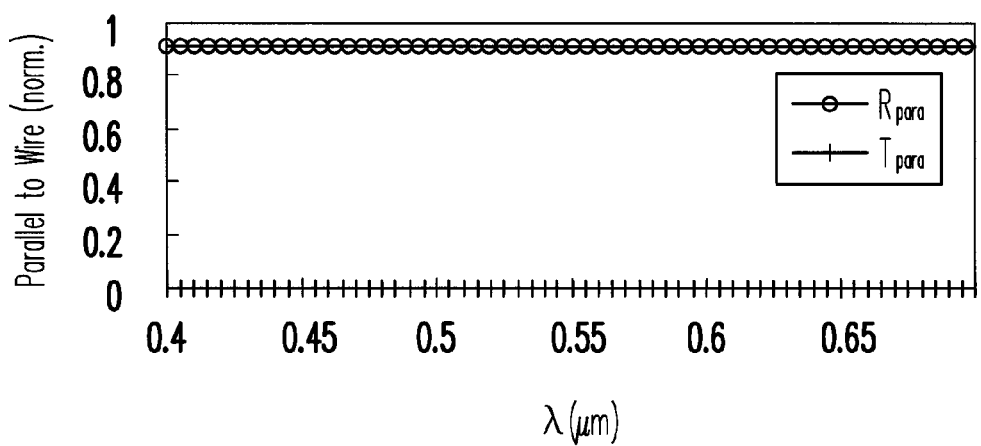
Figure 5D:
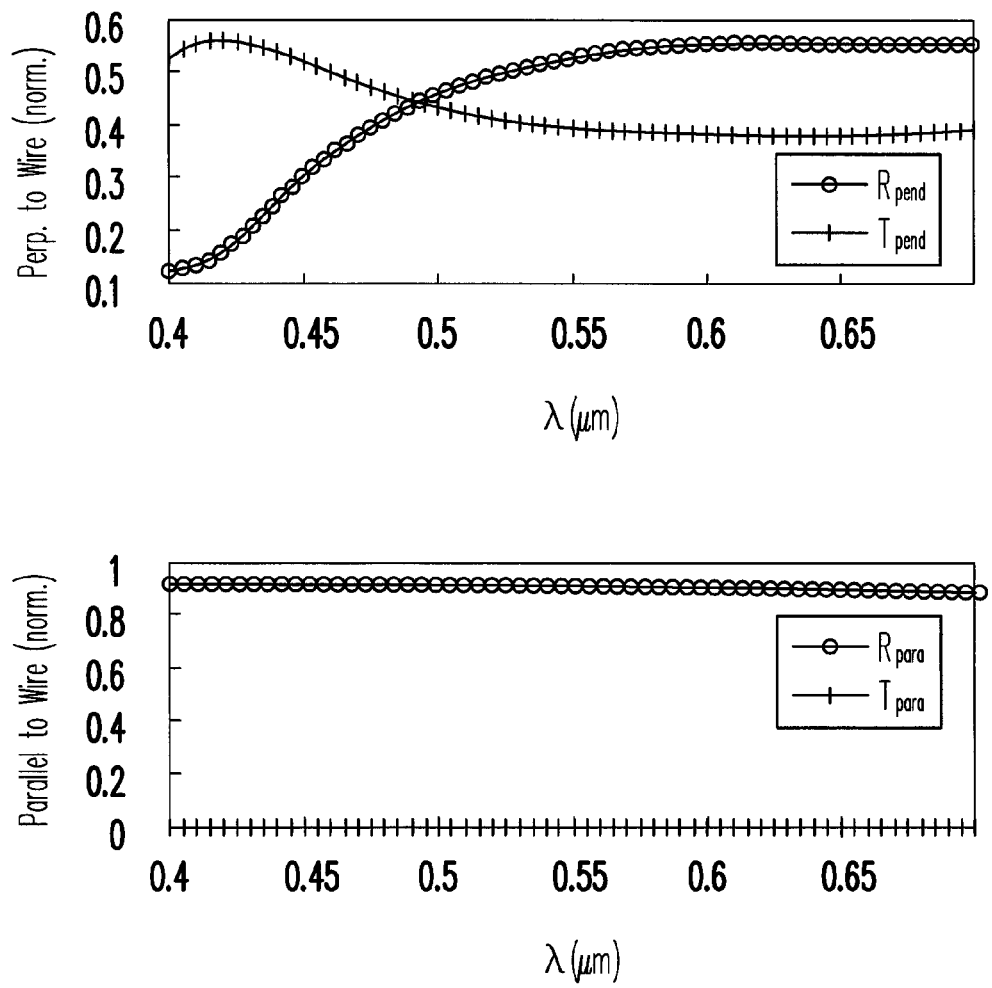

FIG. 4 is a curve diagram of the ratio of the transmittance of the p-polarized light to the transmittance of the s-polarized light of the polarizer in FIG. 1 versus the pitch of the metal wires in FIG. 3. FIG. 4 is simulated with light having wavelength of 445 nm, 532 nm, and 640 nm. Referring to FIG. 4, when the pitch P1 of the metal wires 134 is less than 250 nm, the ratio of the transmittance of the p-polarized light to the transmittance of the s-polarized light Tp/Ts is greater than 10. Significant improvement on performance (i.e. improving Tp/Ts) can be obtained when the pitch P1 is less than 150 nm.

FIGS. 5A-5D are respectively transmittance and reflectance spectra of the polarizer in FIGS. 1-3 when the duties of the metal wires are 10%, 40%, 60%, and 90%, respectively. The vertical axes marked "Perp. to Wire (norm.)" means the transmittance or the reflectance of light having a polarization direction perpendicular to the metal wires 134, wherein "$R_{pend}$" means the reflectance of the light having a polarization direction perpendicular to the metal wires 134, and "$T_{pend}$" means the transmittance of the light having a polarization direction perpendicular to the metal wires 134, and the reflectance and the transmittance are normalized. The vertical axes marked "Parallel to Wire (norm.)" means the transmittance or the reflectance of light having a polarization direction parallel to the metal wires 134, wherein "$R_{para}$" means the reflectance of the light having a polarization direction parallel to the metal wires 134, and "$T_{para}$" means the transmittance of the light having a polarization direction parallel to the metal wires 134, and the reflectance and the transmittance are normalized. The horizontal axes marked "$\lambda(\mu m)$" means the wavelength of light striking the polarizer 130. The duty of the metal wires 134 is defined as the width W1 of each metal wire 134 along the second direction E2 divided by the pitch P1 of the metal wires 134.

Referring to FIGS. 5A-5D, the duty of the metal wires 134 is not a critical factor. In other words, the tolerance of the duty of the metal wires 134 is huge. When the duty of the metal wires 134 falls within the range of 40%-50%, the performance of the polarizer 130 is better.

Figure 6:
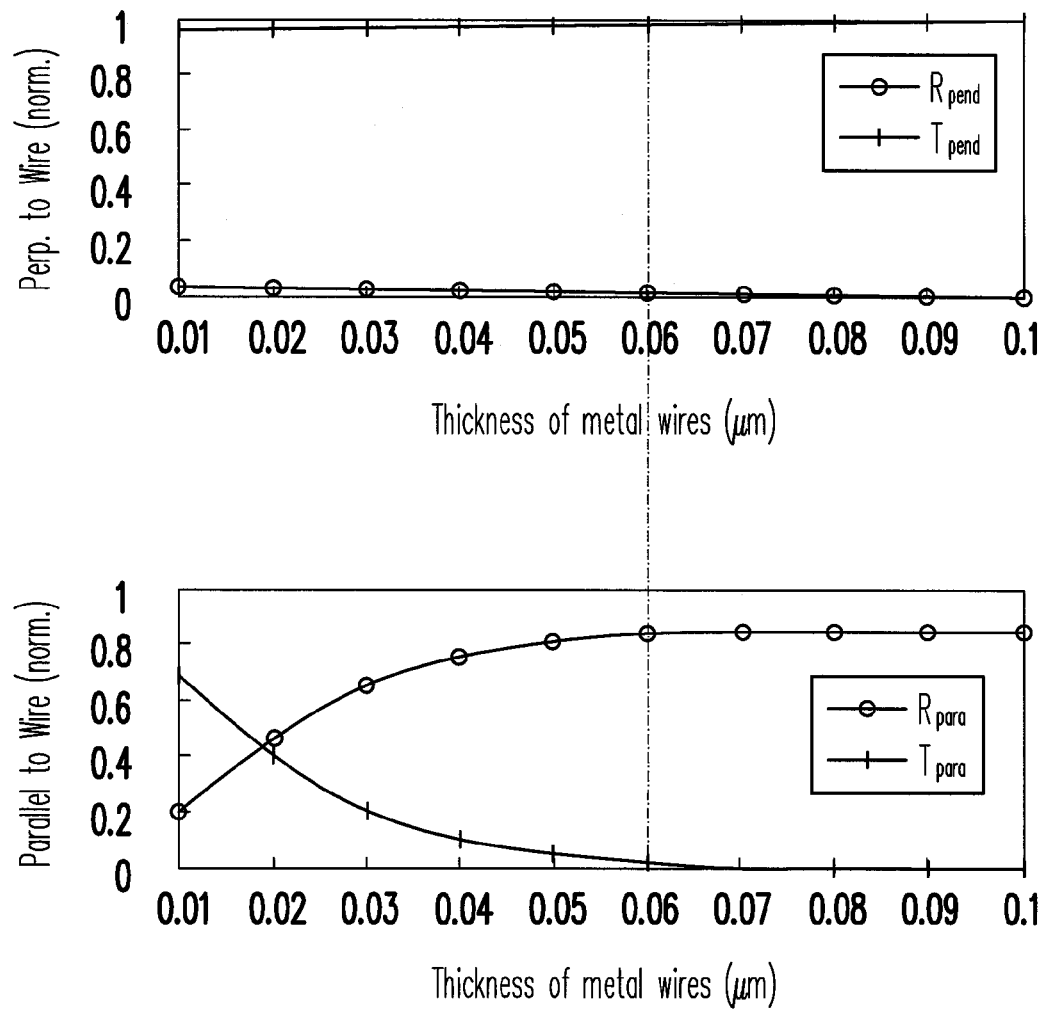
FIG. 6 is curve diagrams showing the transmittance and reflectance of the polarizer in FIGS. 1-3 versus the thickness of the metal wires in FIG. 3.

FIG. 6 is curve diagrams showing the transmittance and reflectance of the polarizer in FIGS. 1-3 versus the thickness of the metal wires in FIG. 3. Referring to FIGS. 3 and 6, the meanings of "Per. to Wire (norm.)", "Parallel to Wire (norm.)", "$R_{pend}$", "$T_{pend}$", "$R_{para}$", and "$T_{para}$" can be referred to the above paragraph explaining FIGS. 5A-5D. The thickness T1 of the metal wires 134 is the thickness of the metal wires 134 along a direction perpendicular to the first direction E1 and perpendicular to the second direction E2. FIG. 6 shows that when the thickness T1 is greater than 60 nm, the performance of the polarizer 130 is good.

In view of the above, in the embodiment of the invention, the polarizer is integrated in the LED package by using the supporter to support the polarizer, so that the LED package can provide a polarized light and have small volume. Moreover, the LED package having wire-grid polarizer according to the embodiment of the invention can be operated in a high temperature, and is robust.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light-emitting diode (LED) package comprising:
a substrate;
an LED chip disposed on the substrate;
a polarizer disposed above the LED chip, wherein the polarizer is a wire-grid polarizer, and the wire-grid polarizer comprises:
a transparent substrate; and
a plurality of metal wires, each of the metal wires extending along a first direction, the metal wires being arranged along a second direction, the metal wires satisfying $0.2<d/\lambda<0.5$, wherein d is a pitch of the metal wires along the second direction, and $\lambda$ is a wavelength of a first light emitted by the LED chip;
a fluorescent layer wrapping the LED chip, wherein the fluorescent layer converts the first light emitted by the LED chip into a second light, a wavelength of the first light is shorter than a wavelength of the second light, the metal wires satisfies $0.2<d/\lambda'<0.5$, and $\lambda'$ is the wavelength of the second light; and
a supporter disposed on the substrate for supporting the polarizer.

2. The LED package according to claim 1 further comprising an anti-reflection layer disposed on the fluorescent layer.

3. The LED package according to claim 1, wherein the fluorescent layer is a phosphor layer.

4. The LED package according to claim 1, wherein a gap exists between the polarizer and the LED chip.

5. The LED package according to claim 4, wherein the gap is an air gap, a gas gap, or a vacuum gap.

6. The LED package according to claim 1, wherein the first direction is substantially perpendicular to the second direction.

7. The LED package according to claim 1, wherein a containing space is formed by the substrate, the supporter, and the polarizer, and the LED chip is disposed inside the containing space.

8. The LED package according to claim 7, wherein the containing space is filled with air or gas.

9. The LED package according to claim 7, wherein the containing space is a vacuum space.

* * * * *